(12) United States Patent
Okazaki et al.

(10) Patent No.: US 7,929,594 B2
(45) Date of Patent: Apr. 19, 2011

(54) SEMICONDUCTOR INTEGRATED CIRCUIT AND RADIO COMMUNICATION APPARATUS FOR COMMUNICATION

(75) Inventors: Takao Okazaki, Tokyo (JP); Satoru Fukuchi, Tokyo (JP)

(73) Assignee: Renesas Electronics Corporation, Kawasaki (JP)

( * ) Notice: Subject to any disclaimer, the term of this patent is extended or adjusted under 35 U.S.C. 154(b) by 1380 days.

(21) Appl. No.: 11/430,009

(22) Filed: May 9, 2006

(65) Prior Publication Data

US 2006/0255874 A1 Nov. 16, 2006

(30) Foreign Application Priority Data

May 10, 2005 (JP) ................................. 2005-136986

(51) Int. Cl.
*H04B 1/38* (2006.01)
*H04L 27/00* (2006.01)
*H04L 7/00* (2006.01)

(52) U.S. Cl. ........................ 375/219; 375/326; 375/355

(58) Field of Classification Search .......... 375/219–220, 375/223, 260–261, 268–269, 271–273, 295, 375/298, 308, 326, 354, 355; 455/257–258, 455/260, 264, 313–314, 316, 332–333, 552.1, 455/84–87; 332/105, 135; 329/323, 325, 329/326, 306–309; 331/1 A, 2, 4, 18, 20, 331/23, 34, 40, 46–47, 52; 327/100, 102, 327/113, 50, 58, 91
See application file for complete search history.

(56) References Cited

U.S. PATENT DOCUMENTS

| | | | | |
|---|---|---|---|---|
| 4,932,072 A | * | 6/1990 | Toko | .................. 455/76 |
| 5,608,355 A | | 3/1997 | Noguchi | |
| 6,034,990 A | * | 3/2000 | Kang | ............... 375/219 |
| 6,442,389 B1 | * | 8/2002 | Marcum | ........... 455/437 |
| 6,516,184 B1 | * | 2/2003 | Damgaard et al. | ........... 455/86 |

(Continued)

FOREIGN PATENT DOCUMENTS

JP  8-307252  11/1996

(Continued)

OTHER PUBLICATIONS

Porret, A., A Ultralow-Power UHF Transceiver Integrated in A Standard Digital CMOS Process: Architecture and Receiver, 2001, Solid State Circuits, IEEE Journal of, vol. 36, Issue: 3, pp. 452-466.*

*Primary Examiner* — Tesfaldet Bocure
*Assistant Examiner* — Lawrence B Williams
(74) *Attorney, Agent, or Firm* — Mattingly & Malur, P.C.

(57) ABSTRACT

A total power consumption of a radio communication apparatus is reduced, the radio communication apparatus including a semiconductor integrated circuit (high-frequency IC) which has a clock generation circuit which generates a reference clock signal for use in modulating a transmit signal and demodulating a received signal. The clock generation circuit is provided with a voltage-controlled oscillator circuit (VCXO) which oscillates, when a quartz oscillator is connected thereto, at a frequency dependent on a natural frequency of the quartz oscillator and a control voltage applied thereto. The voltage-controlled oscillator circuit is configured such that a result obtained by converting, in an internal D/A converter circuit, digital frequency control information supplied from the baseband circuit is applied as the control voltage to the voltage-controlled oscillator circuit and such that the voltage-controlled oscillator circuit oscillates at a frequency corresponding to the control voltage.

15 Claims, 6 Drawing Sheets

U.S. PATENT DOCUMENTS

| | | | |
|---|---|---|---|
| 6,529,730 B1 * | 3/2003 | Komaili et al. | 455/452.2 |
| 6,847,812 B2 * | 1/2005 | Doetsch et al. | 455/316 |
| 6,900,700 B2 * | 5/2005 | Oosawa et al. | 331/46 |
| 6,985,705 B2 * | 1/2006 | Shohara | 455/164.1 |
| 7,148,764 B2 * | 12/2006 | Kasahara et al. | 331/179 |
| 7,154,341 B2 * | 12/2006 | Yamamoto et al. | 331/2 |
| 7,162,213 B2 * | 1/2007 | Watanabe et al. | 455/118 |
| 7,286,074 B2 * | 10/2007 | Kudoh et al. | 341/162 |
| 2002/0065650 A1 * | 5/2002 | Christensson et al. | 455/86 |
| 2004/0053695 A1 * | 3/2004 | Mattice et al. | 463/42 |
| 2004/0077327 A1 * | 4/2004 | Lim et al. | 455/318 |
| 2008/0096490 A1 * | 4/2008 | Okazaki et al. | 455/76 |
| 2008/0113625 A1 * | 5/2008 | Maeda et al. | 455/67.14 |

FOREIGN PATENT DOCUMENTS

| | | |
|---|---|---|
| JP | 2001-186048 | 7/2001 |
| JP | 2003-124808 | 4/2003 |
| JP | 2003-152449 | 5/2003 |

* cited by examiner

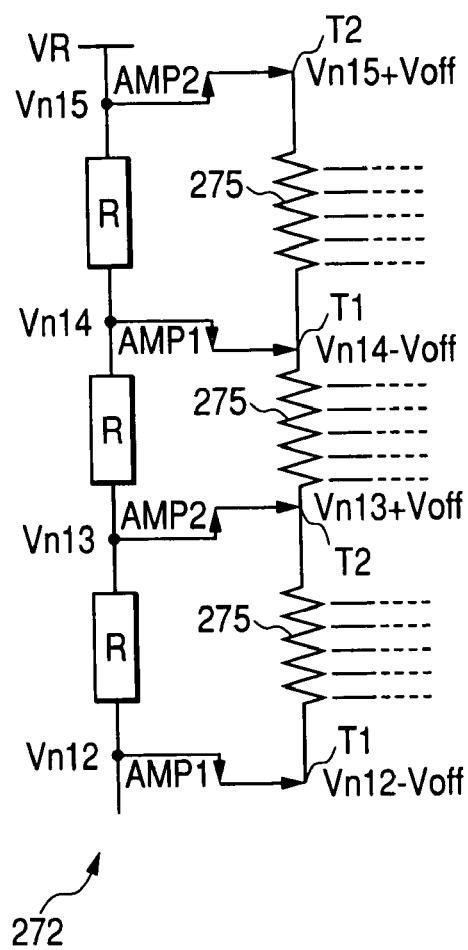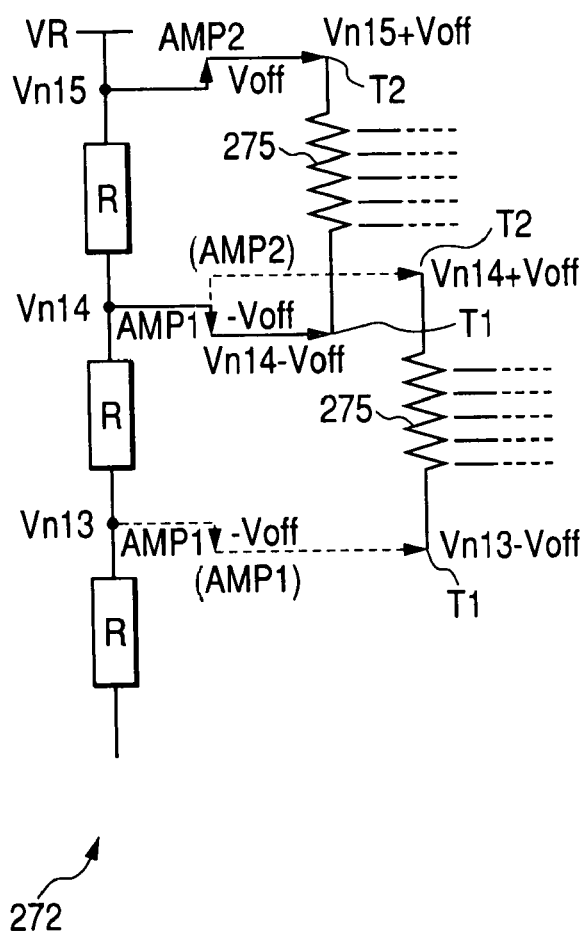
FIG. 6(A)
FIG. 6(B)

SEMICONDUCTOR INTEGRATED CIRCUIT AND RADIO COMMUNICATION APPARATUS FOR COMMUNICATION

CROSS-REFERENCE TO RELATED APPLICATION

The present application claims priority from Japanese patent application No. 2005-136986 filed on May 10, 2005, the content of which is hereby incorporated by reference into this application.

BACKGROUND OF THE INVENTION

The present invention relates to technology effective when applied to a semiconductor integrated circuit for communication incorporating a voltage-controlled oscillator circuit, particularly an oscillator circuit using a quartz oscillator, and a radio communication apparatus using the semiconductor integrated circuit for communication. The technology is effectively applicable, for example, in a high-frequency semiconductor integrated circuit incorporating an oscillator circuit which generates a reference clock signal for use in processing transmit and received signals, by being used in a case where oscillation frequency information as a digital signal is given from a baseband circuit.

In the inventions described in the patent documents 1 to 4, a semiconductor integrated circuit incorporating a voltage-controlled oscillator circuit (VCO) is provided with a D/A converter enabling oscillation frequency control by means of a digital signal.

In the invention described in the patent document 1, a first counter for counting oscillator signals of a voltage-controlled oscillator circuit (VCO), a second counter for counting reference frequency signals, an AND circuit for taking a logical AND of outputs of the two counters, a third counter for counting outputs of the AND circuit, a register for holding an output of the third counter, and a D/A converter circuit for converting a digital value held in the register into an analog signal are provided, and the output of the D/A converter circuit is used to control the oscillation frequency of the VCO, enabling a center frequency to be automatically adjusted.

The invention described in the patent document 2 relates to a PLL frequency synthesizer using a multi-modulus prescaler capable of reducing noise effect on a high-frequency RF circuit.

In the invention described in the patent document 3, a pulse arithmetic circuit which computes the number of times a 1-bit D/A converter is to be driven based on the difference between the latest digital temperature-compensated data that corresponds to a temperature sensor output obtained from a ROM and the immediately preceding digital temperature-compensated data, the 1-bit D/A converter to be controlled based on the output of the pulse arithmetic circuit, and an analog accumulator which updates its output by sequentially adding the output of the 1-bit D/A converter to its current output are provided. The oscillation frequency of the digital temperature-compensated oscillator (VCXO) is prevented from changing sharply with temperature variation, and phase modulation errors of a communication apparatus using the VCXO can be reduced.

According to the invention described in the patent document 4, in a frequency hopping radio communication apparatus using spectrum diffusion technology, an antenna terminal is disposed in a central part of one end portion of the package, a transmit data input terminal and a received data output terminal are disposed in two side portions of the other end portion of the package, and a PLL frequency synthesizer circuit is disposed in an approximately central portion of the package. In this arrangement, a transmission circuit and a reception circuit are discretely disposed on two side portions of the package with the PLL frequency synthesizer circuit disposed between the two circuits so as to prevent data omission and error rate deterioration due to mutual interference between signals.

Patent document 1: Japanese Unexamined Patent Publication No. Hei 8 (1996)-307252
Patent document 2: Japanese Unexamined Patent Publication No. 2003-124808
Patent document 3: Japanese Unexamined Patent Publication No. 2003-152449
Patent document 4: Japanese Unexamined Patent Publication No. 2001-186048

SUMMARY OF THE INVENTION

A radio communication apparatus such as a portable telephone generally includes a high-frequency IC which has functions for modulating, demodulating, upconverting and downcoverting a transmit signal or a received signal, a baseband IC which converts transmit data into an I signal and a Q signal, the I signal and the Q signal being an in-phase component and an orthogonal component of a fundamental wave, respectively, and which processes I and Q signals demodulated from a received signal to restore data, and a power module inclusive of a power amplifier which outputs, after power-amplifying, a transmit signal. Conventionally, the I and Q signals transferred between the high-frequency IC and the baseband IC, in many cases, are analog signals.

On the other hand, most processing performed in the baseband IC is digital, so that the baseband IC is provided with an A/D converter circuit which converts received analog I and Q signals inputted thereto into digital signals and a D/A converter circuit which converts transmit digital I and Q signals into analog signals. As the baseband IC, while being mostly composed of digital circuits, incorporates such analog circuits as the A/D converter circuit and the D/A converter circuit, the baseband IC production process requires a step in which analog circuit elements are formed. This causes a problem of increasing chip costs.

In view of the above problem, a technique has been proposed in which a high-frequency IC is provided with an A/D converter circuit and a D/A converter circuit and in which I and Q signals are transmitted as digital signals between the high-frequency IC and a baseband IC. In this arrangement, with the high-frequency IC being provided with an A/D converter circuit and a D/A converter circuit, the baseband IC requires no A/D converter circuit and no D/A converter circuit. This makes it unnecessary for the baseband IC production process to include a step for forming analog circuit elements, so that chip cost can be reduced. Also, when a baseband IC includes digital circuits only, it can be designed to be operable at a low supply voltage, for example, 1.8 V so as to reduce its power consumption. Furthermore, digitizing I and Q signals can improve the SN ratio (signal-to-noise ratio) of the circuit.

According to the GSM (Global System for Mobile Communication) standard that is a communication standard for portable telephones, a baseband IC supplies a high-frequency IC with a frequency control signal for an oscillator circuit for the purpose of making a reference clock signal used in a base station and a reference clock signal generated in the high-frequency IC coincide with each other. According to the GSM standard, a maximum allowable error in reference clock frequency is 0.1 ppm.

In conventional GSM-type portable telephones, a frequency control signal used to adjust a reference clock signal frequency has generally been an analog signal. Therefore, to realize a baseband IC free of analog circuits, it is necessary to also digitize the frequency control signal. In the inventions described in the patent documents 1 to 4, a semiconductor integrated circuit having a built-in voltage-controlled oscillator circuit (VCO) is provided with an A/D converter so as to enable oscillation frequency control by means of a digital signal.

According to the invention described in the patent document 1, the oscillation frequency of the VCO is controlled using the output of the D/A converter to which internally generated data is inputted. Namely, unlike in the invention of the present application, no oscillation frequency information is given from outside. Also, the VCO described in the patent document 1 is for generating a carrier signal used to record and reproduce an audio signal in a VHS-type VTR. Therefore, the VCO differs in use from the oscillator circuit of the invention of the present application that is used to generate a reference clock signal for use in modulating or demodulating a transmit signal or a received signal.

The invention described in the patent document 2 relates to a PLL frequency synthesizer using a multi-modulus prescaler capable of reducing noise effect on a high-frequency RF circuit. The invention uses a VCO, but no D/A converter for converting digital oscillation frequency information into an analog signal is provided.

The invention described in the patent document 3 uses a D/A converter, but the D/A converter is to prevent, by using digital temperature-compensated data that corresponds to an output of a temperature sensor, the oscillation frequency of the oscillator (VCXO) from changing sharply with temperature variation. Therefore, the function of the D/A converter is different from that of the D/A converter used in the invention of the present application that converts digital oscillation frequency information supplied from a baseband circuit into an analog signal for use in controlling the frequency of the oscillator (VCXO).

The invention described in the patent document 4 uses a configuration including a D/A converter which generates, by digital-to-analog conversion, an analog signal used to control the frequency of a VCO. The D/A converter converts transmit data into an analog signal. The patent document 4 does not state that the D/A converter converts oscillation frequency information for the VCO into an analog signal.

An object of the present invention is to reduce a total power consumption of a radio communication apparatus including a semiconductor integrated circuit for communication (high-frequency IC) and a baseband circuit, the semiconductor integrated circuit having functions for demodulating and down-converting a received signal and for modulating and upconverting a transmit signal.

Another object of the present invention is to obtain a desired frequency accuracy in a semiconductor integrated circuit for communication (high-frequency IC) incorporating an oscillator circuit which generates a reference clock signal for use in modulating a transmit signal and demodulating a received signal, even in a configuration where oscillation frequency information is given as a digital signal from a baseband circuit while avoiding increasing the circuit area.

The above and other objects, and novel features of the present invention will become apparent from the following detailed description and the accompanying drawings.

The following is an outline of a representative one of the inventions disclosed in the present application.

In a semiconductor integrated circuit for communication (high-frequency IC) incorporating a clock generation circuit for generating a reference clock signal for use in modulating a transmit signal and demodulating a received signal, the clock generation circuit is provided with a voltage-controlled oscillator circuit which oscillates, when a quartz oscillator is connected thereto, at a frequency dependent on a natural frequency of the quartz oscillator and a control voltage applied thereto. The voltage-controlled oscillator circuit is configured such that a result obtained by converting, in an internal D/A converter circuit, digital frequency control information supplied from the baseband circuit is applied as the control voltage to the voltage-controlled oscillator circuit and such that the voltage-controlled oscillator circuit oscillates at a frequency corresponding to the control voltage.

When the above arrangement is used, the baseband circuit requires no A/D converter circuit and no D/A converter circuit. This makes it unnecessary for a baseband IC production process to include a step for forming analog circuit elements, so that chip cost can be reduced. Also, when a baseband IC includes digital circuits only, it can be designed to be operable at a low supply voltage, for example, 1.8 V so as to reduce its power consumption. This leads to a reduction in the total power consumption of a radio communication apparatus provided with a high-frequency IC and a baseband circuit.

Preferably, the D/A converter circuit that converts the digital frequency control information into an analog signal includes a first conversion section which generates multi-level voltages corresponding to several high-order bits of an input digital signal and a second conversion section which generates multi-level voltages corresponding to bits other than the several high-order bits of the input digital signal. Furthermore, the first conversion section and the second conversion section each include: a resistive voltage divider circuit which generates multi-level potentials by a prescribed resistance ratio; and a selector circuit which selects a potential of a node of the resistive voltage divider circuit. The selector circuit of the first conversion section is configured such that, when selecting a potential of an odd-numbered node of the resistive voltage divider circuit of the first conversion section, it supplies the potential of the selected node to a first tap of the resistive voltage divider circuit of the second conversion section, and, when selecting a potential of an even-numbered node of the resistive voltage divider circuit of the first conversion section, it supplies the potential of the selected node to a second tap of the resistive voltage divider circuit of the second conversion section. With these arrangements made, it is possible to realize an A/D converter circuit having a high conversion accuracy and requiring a relatively small circuit area.

According to the present invention, it is possible to reduce the total power consumption of a radio communication apparatus provided with a semiconductor integrated circuit for communication (high-frequency IC), which has functions for modulating/demodulating and upconverting/downconverting a transmit signal or a received signal, and a baseband circuit.

BRIEF DESCRIPTION OF THE DRAWINGS

FIGS. 6 (A) and 6 (B) are schematic diagrams, of which FIG. 6 (A) shows voltage applications dependent on the operation of the selectors shown in FIG. 4 and FIG. 6 (B) shows voltage applications dependent on the operation of the selectors shown in FIG. 5.

DETAILED DESCRIPTION OF THE PREFERRED EMBODIMENT

An embodiment of the present invention will be described in the following with reference to the accompanying drawings.

Figure 1:
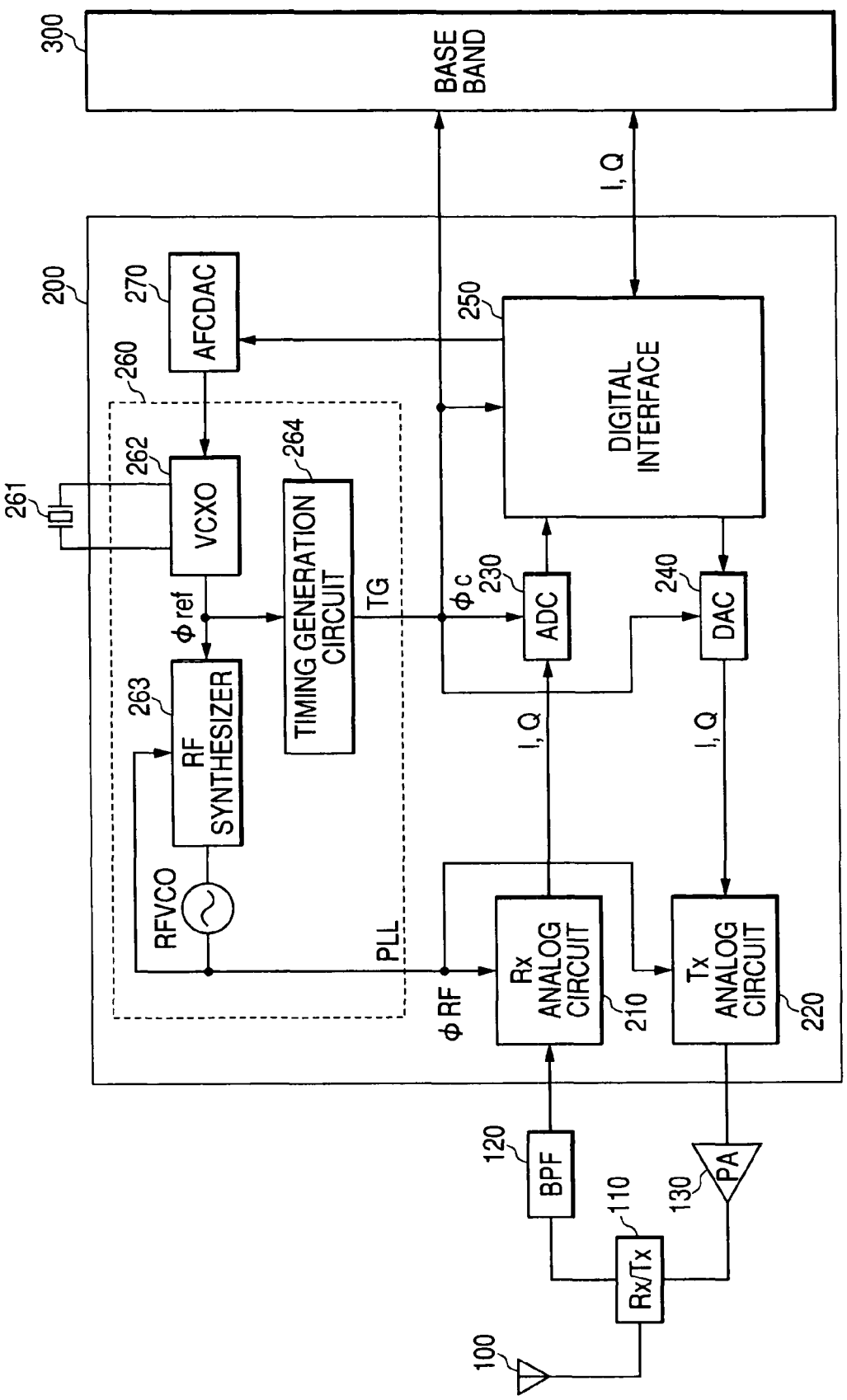
FIG. 1 is a block diagram showing an overall embodiment, in a case in which the present invention is applied to a high-frequency IC used in a GSM-type portable telephone, of the high-frequency IC and a radio communication apparatus.

FIG. 1 shows an example of an overall configuration of a high-frequency IC and a radio communication apparatus according to the present invention, the IC and the apparatus being for GSM (including both narrowly-defined GSM in which GMSK modulation is made and broadly-defined GSM inclusive of EDGE mode in which 8PSK modulation is made) radio communication.

As shown in FIG. 1, the radio communication apparatus includes an antenna 100 for transmission and reception, a switch 110 for switching between transmission and reception, a band-pass filter 120 for removing unwanted waves from a received signal, a high-frequency power amplifier circuit 130, a high-frequency IC 200, and a baseband IC 300.

The high-frequency IC 200 has functions for demodulating and downconverting a received signal and for modulating and upconverting a transmit signal. The baseband IC 300 performs baseband processing such as generating I and Q signals for transmission by encoding transmit data and decoding received I and Q signals. Though not particularly limited, the high-frequency IC 200 and the baseband IC 300 are each formed, using known semiconductor integrated circuit manufacturing technology, as a semiconductor integrated circuit on a discrete monocrystal silicon chip.

The high-frequency IC 200 includes a reception analog circuit 210 and a transmission analog circuit 220. The reception analog circuit 210 downconverts a signal received from the antenna 100 into an audio frequency signal, or demodulates the signal into I and Q signals. The transmission analog circuit 220 has functions for modulating a carrier signal using I and Q signals for transmission and for upconverting a transmit signal to a signal of several gigahertz. The high-frequency IC 200 also includes an A/D converter circuit 230 and a D/A converter circuit 240. The A/D converter circuit 230 converts analog I and Q signals demodulated at the reception analog circuit 210 into digital signals. The D/A converter circuit 240 converts digital I and Q signals for transmission supplied from the baseband IC 300 into analog signals.

The high-frequency IC 200 further includes a digital interface 250 which performs data exchanges using digital signals between the high-frequency IC 200 and the baseband IC 300. The high-frequency IC 200 still further includes a clock generation circuit 260 which generates a clock signal of a prescribed frequency for use in signal processing at the reception analog circuit 210, the transmission analog circuit 220, the A/D converter circuit 230, and the D/A converter circuit 240. Furthermore, the high-frequency IC 200 includes a D/A converter circuit 270 which converts digital frequency control information for the clock generation circuit 260 into an analog signal. The digital frequency control information is supplied from the baseband IC 300 to the clock generation circuit 260 via the digital interface 250.

The clock generation circuit 260 includes a PLL circuit and a timing generation circuit (TG) 264. The PLL circuit includes a voltage-controlled oscillator circuit (VCXO) 262 which oscillates, using an external quartz oscillator 261 as an oscillating element, at a variable frequency determined by the natural frequency of the quartz oscillator 261 and a control voltage applied to the VCXO 262, an RFVCO which generates, using an oscillator signal φref generated by the VCXO 262 as a reference clock, a local oscillator signal (high-frequency signal) φRF with a frequency higher than that of the φref, and a frequency synthesizer 263. The TG 264 generates an operation clock signal φc by frequency dividing and phase shifting the oscillator signal φref generated by the VCXO 262. The operation clock signal φc is used to determine timing of internal circuit operation. A VCXO refers to an oscillator whose oscillation frequency, being dependent on an external quartz oscillator, can be adjusted by switching the magnitude of internal load by means of an external control signal. There are cases in which an oscillator whose oscillation frequency can be adjusted using an external digital control signal is referred to as a DCXO. The voltage-controlled oscillator circuit 262 of the present embodiment may therefore be referred to as a DCXO. That is, the DCXO falls into the VCXO category.

For the oscillator signal φref of the VCXO 262, a frequency of, for example, 26 MHz (or 13 MHz) is selected. This is because quartz oscillators of such a frequency can be easily obtained as general-purpose parts. The local oscillator signal φRF generated by the PLL circuit 263 is used to demodulate and downconvert a received signal at the reception analog circuit 210 and also to modulate and upconvert a transmit signal at the transmission analog circuit 220. For frequency conversion in the reception analog circuit 210 or the transmission analog circuit 220, a mixer is used.

Though not shown in FIG. 1, the high-frequency IC 200 is provided with a control circuit composed of a logic circuit for controlling internal operation of the IC. The logic circuit including the control circuit is designed to be operable at a supply voltage of as low as 1.8 V even in cases where analog circuits other than the control circuit are operated at a supply voltage of 2.8 V. This reduces the power consumption of the high-frequency IC 200 compared to cases where all circuits are designed for operation at a supply voltage of 2.8 V.

Figure 2:
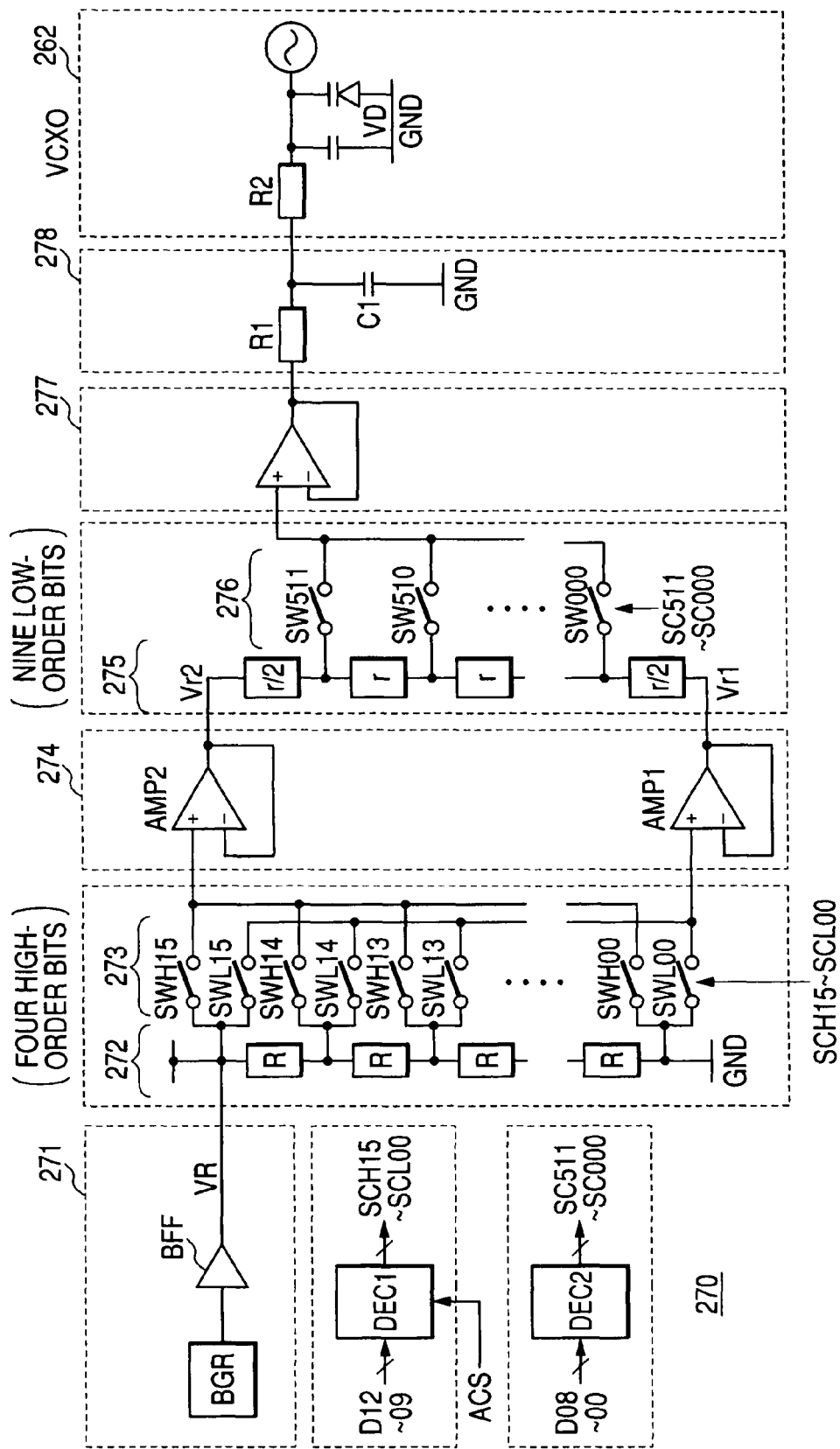
FIG. 2 is a circuit configuration diagram showing a concrete example of a circuit configuration of a D/A converter circuit for converting digital frequency control information into an analog signal.

FIG. 2 shows a concrete example of a circuit configuration of the D/A converter circuit 270 that converts digital frequency control information into an analog signal. Though not particularly limited, the information inputted to the D/A converter circuit 270 of the present embodiment is composed of 13 bits, of which four high-order bits and nine low-order bits are separately converted into analog data in two stages. The number, 13, of information bits to be processed for DA conversion by the D/A converter circuit 270 has been determined to be in conformity with the GSM standard that requires the variable range of reference clock frequency to be within ±20 ppm and the frequency accuracy to be 0.1 ppm or better. With the number of input bits being 13, the frequency accuracy can be calculated as "40 ppm÷$2^{13}$≈0.005 ppm". Thus, the reference clock frequency can be adjusted with an accuracy of 0.01 ppm or better per LSB (least significant bit) to be well in conformity with the GSM standard.

As shown in FIG. 2, the D/A converter circuit 270 includes a reference voltage circuit 271 and a resistive voltage divider circuit 272. The reference voltage circuit 271 includes a bandgap reference circuit BGR and a buffer amplifier BFF, and generates a constant voltage VR which is not dependent on the supply voltage and temperature. The resistive voltage divider circuit 272 generates multi-level potentials by dividing the constant voltage VR generated by the reference voltage circuit 271 by a prescribed resistance ratio.

The D/A converter circuit 270 also includes a selector 273 which selects an optional pair of the potentials generated by the resistive voltage divider circuit 272 and a voltage follower 274 composed of buffer amplifiers AMP1 and AMP2 which output voltages Vr1 and Vr2 selected by the selector 273 after subjecting them to impedance conversion. The resistive voltage divider circuit 272 and the selector 273 make up a first conversion section for generating multi-level potentials.

The D/A converter circuit 270 further includes a second resistive voltage divider circuit 275 which generates multi-level potentials by dividing the two voltages Vr1 and Vr2 having undergone impedance conversion by a prescribed resistance ratio and a selector 276 which selects an optional one of the potentials generated by voltage division at the resistive voltage divider circuit 275. The resistive voltage divider circuit 275 and the selector 276 make up a second conversion section for generating multi-level potentials.

The D/A converter circuit 270 still further includes decoders DEC1 and DEC2 which respectively control the selectors 273 and 276, a voltage follower 277 which outputs the voltage selected by the selector 276 after subjecting it to impedance conversion, and a low-pass filter 278 which stabilizes the output voltage of the voltage follower 277. The voltage smoothed by the low-pass filter 278 is applied to a varactor diode VD making up the voltage-controlled oscillator circuit (VCXO) 262 causing the oscillation frequency of the VCXO to be controlled according to the applied voltage.

The decoders DEC1 and DEC2 generate selection control signals for the selectors 273 and 276 by decoding frequency control information D12 to D0 supplied from the baseband IC 300. In the present embodiment, the resistive voltage divider circuit 272 is configured to generate 16-level potentials. Correspondingly, the first decoder DEC1 generates 16 control signals SCH00/SCL00 to SCH15/SCL15 by decoding the four high-order bits D12 to D9 out of the 13 bits of frequency control information. The selector 273 is composed of 16 pairs of switches SWH00/SWL00 to SWH15/SWL15.

The resistive voltage divider circuit 275 is configured to generate 512-level potentials. The selector 276 includes 512 switches SW000 to SW511. Correspondingly, the second decoder DEC2 generates 512 control signals SC000 to SC511 by decoding the nine low-order bits D8 to D0 out of the 13 bits of frequency control information. In the present embodiment, the decoder DEC1 is configured such that the signal levels of outputs SCH00/SCL00 to SCH15/SCL15 corresponding to a same input code are reversed depending on a control signal ACS. To be more concrete, in a case where, when ACS is 1, SCH00 is high and SCL00 is low, SCH00 turns low and SCL00 turns high when ACS is 0.

When consideration is given to the number of elements making up the whole D/A converter circuit, or the total area of the D/A converter circuit, it may be appropriate, in order to equalize the number of bits to be processed by the decoders DEC1 and DEC2, to configure the circuit such that the resistive voltage divider circuits 272 and 275 are approximately identical in terms of the number of potentials they generate by voltage division and such that the selectors 273 and 276 are approximately identical in terms of the number of switches they include. In the D/A converter circuit 270 of the present embodiment, however, more divided voltages are generated in the downstream resistive voltage divider circuit 275 than in the upstream resistive voltage divider circuit 272 so as to enhance conversion accuracy. To be more concrete, such an arrangement has been made as a result of considering variations in offsets of the amplifiers AMP1 and AMP2 making up the voltage follower 274. The reason why the D/A converter circuit of the present embodiment offers higher conversion accuracy will be described in the following.

Figure 3:
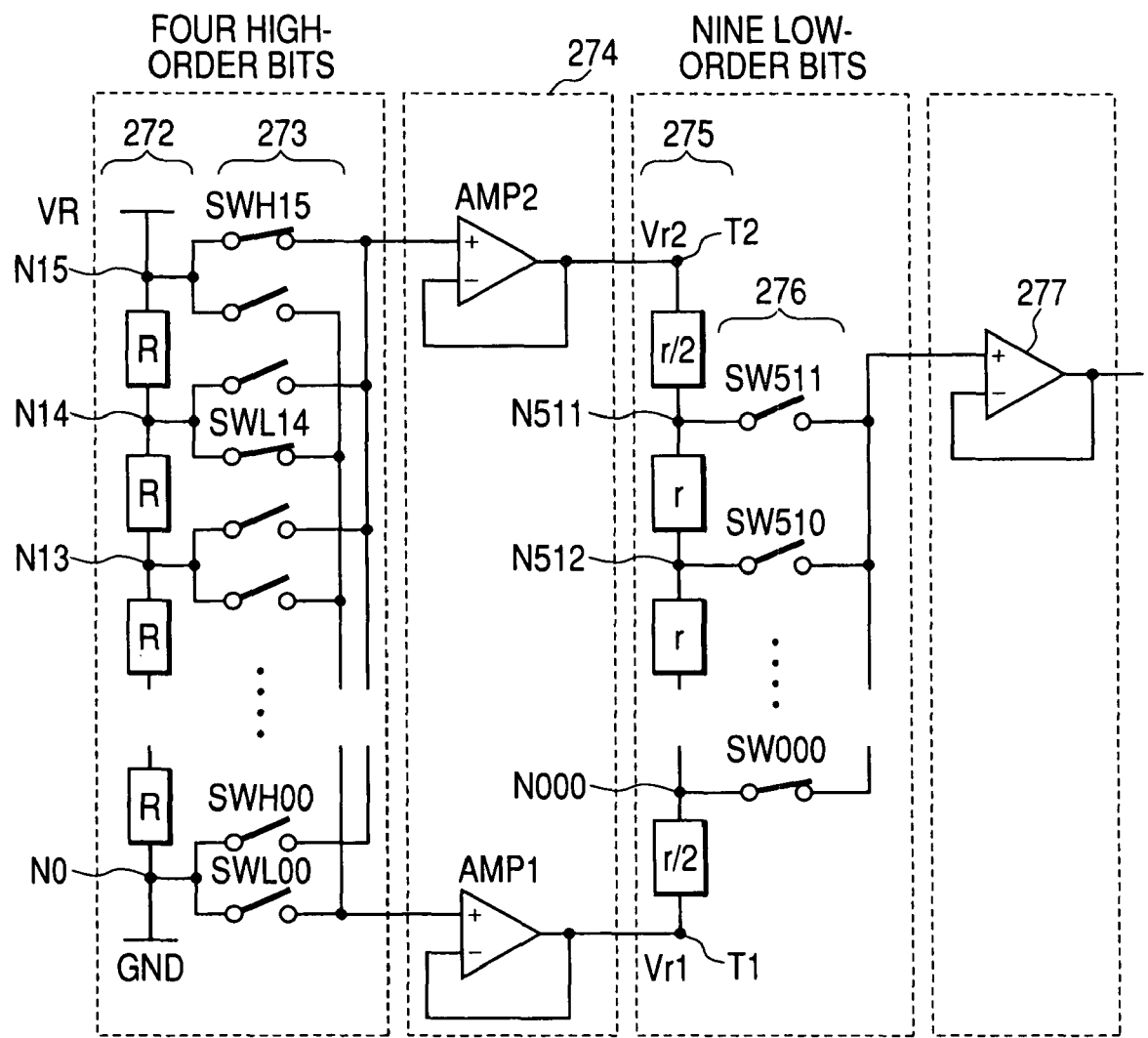
FIG. 3 is a schematic diagram showing an operating state of the selectors in the D/A converter circuit shown in FIG. 2.

FIG. 3 shows a state of the selectors 273 and 276 with "1111000000000" supplied as the frequency control information D12 to D0 to the D/A converter circuit 270. In the state, switches SWH15 and SWL14 are on, causing the potentials of nodes N15 and N14 of the resistive voltage divider circuit 272 to be inputted to the amplifiers AMP2 and AMP1, respectively, of the voltage follower 274. In the state, switch SWL000 is also on, causing the potential of node N000 of the resistive voltage divider circuit 275 to be inputted to the voltage follower 277.

Figure 4:
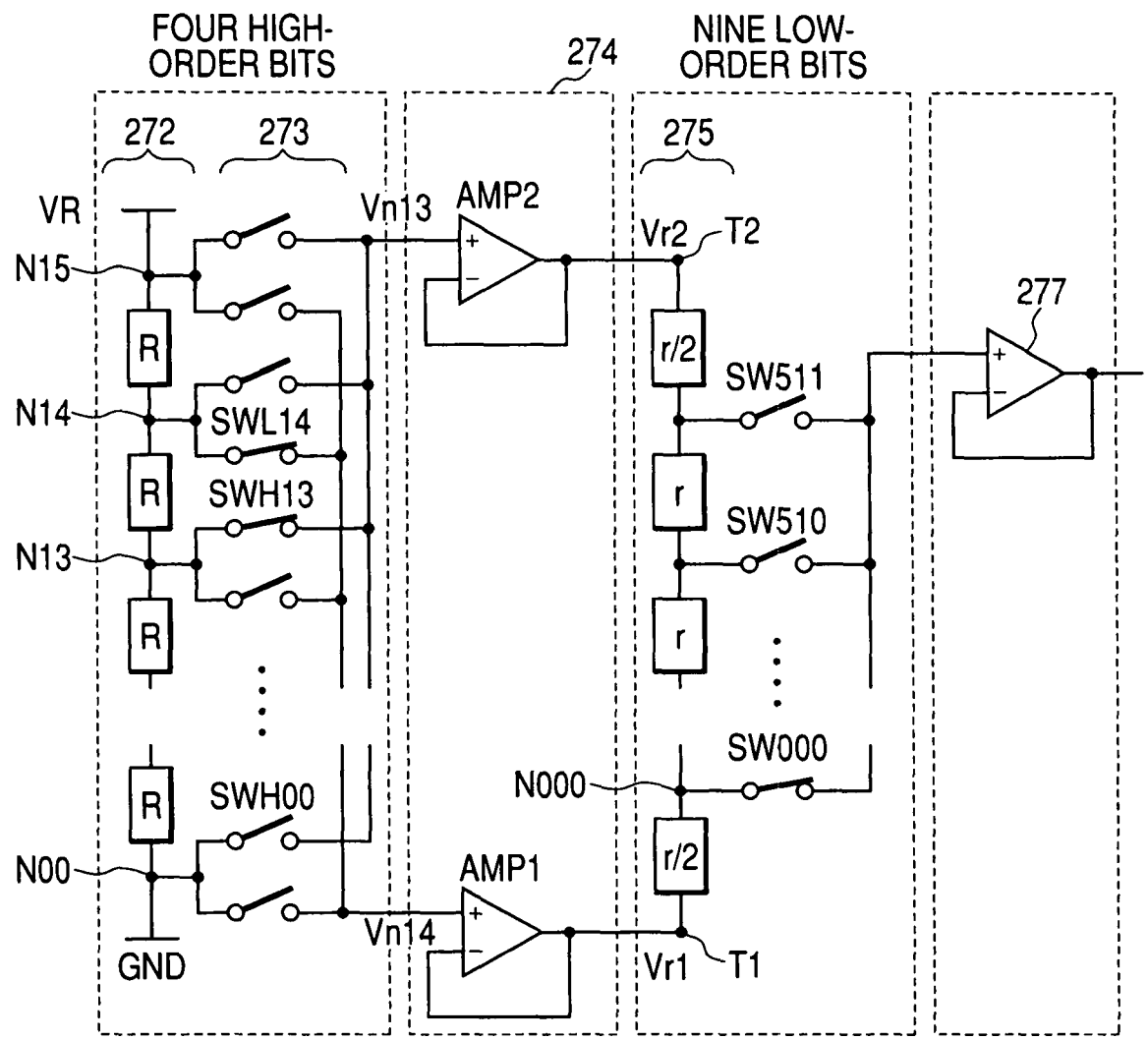
FIG. 4 is a schematic diagram showing an operating state of the selectors in the D/A converter circuit shown in FIG. 2.

When, in the above state, the frequency control information D12 to D0 is decreased by 1 LSB to "1110111111111", switch SWL14 remains on and switch SWH13 turns on, causing the potentials of nodes N14 and N13 of the resistive voltage divider circuit 272 to be inputted to the amplifiers AMP1 and AMP2, respectively, of the voltage follower 274 as shown in FIG. 4. Namely, the relationship in terms of input potentials between the amplifiers AMP1 and AMP2 is reversed. In this case, switch SW000 turns on, causing the potential of node N000 of the resistive voltage divider circuit 275 to be inputted to the voltage follower 277.

Output voltages Vr2 and Vr1, shown in FIG. 3, of the amplifiers AMP2 and AMP12 included in the voltage follower 274 can be expressed by the following equations, respectively:

$$Vr2 = Vn15 + Voff2$$

$$Vr1 = Vn14 + Voff1$$

where Voff1 represents an offset voltage of AMP1, Voff2 represents an offset voltage of AMP2, Vn15 represents a potential of node N15, and Vn14 represents a potential of node N14.

When the resistor ratio variation of the resistive voltage divider circuit 275 is ignored, the potential difference VLSB corresponding to 1 LSB can be expressed as follows:

$$VLSB = (VR2 - Vr1)/2^9 = (Vn15 - Vr14 + Voff2 - Voff1)/2^9$$

Where VR represents the supply voltage for the resistive voltage divider circuit 272:

$$Vn15 - Vn14 = VR/2^4$$

From the above:

$$VLSB = \{1 + (Voff2 - Voff1) \times 2^4/VR\} VR/2^{13} \quad (1)$$

Similarly, in the case shown in FIG. 4, the potential difference VLSB' corresponding to 1 LSB can be expressed as follows:

$$VLSB' = \{1 - (Voff2 - Voff1) \times 2^4/VR\} VR/2^{13} \quad (2)$$

From equations (1) and (2), where the offset voltages Voff1 and Voff2 of the amplifiers AMP1 and AMP2 are identical in polarity and magnitude:

$$(Voff2 - Voff1) = 0$$

Therefore:

$$VLSB = VLSB'$$

From this, it is known that potential switching in the resistive voltage divider circuit 272 causes no error.

On the other hand, where the offset voltages Voff1 and Voff2 of the amplifiers AMP1 and AMP2 are identical in magnitude while being opposite to each other in polarity, that is, "Voff2=Voff" and "Voff1=−Voff", the following equations can be obtained from equations (1) and (2):

$$VLSB = \{1 + 2Voff \times 2^4/VR\}VR/2^{13} \quad (3)$$

$$VLSB' = \{1 - 2Voff \times 2^4/VR\}VR/2^{13} \quad (4)$$

From equations (3) and (4), it is known that, where the offset voltages of the amplifiers AMP1 and AMP2 are identical in magnitude while being opposite to each other in polarity, potential switching in the resistive voltage divider circuit 272 causes an error δ of "$2Voff \times 2^4/VR$". When it is assumed that Voff is 5 mV and that VR is 2.5 V, the error δ is 0.064 (=6.4%). This is a 1-LSB error of the D/A converter circuit 270 having four high-order bits and nine low-order bits.

The inventors proceeded to calculate, in the same way as above, the 1-LSB error δ of the D/A converter circuit 270 in two more cases, that is, with the D/A converter circuit 270 having five high-order bits and eight low-order bits and with the D/A converter circuit 270 having six high-order bits and seven low-order bits. As a result, they found that a 1-LSB error δ caused by switching of high-order bits made in the D/A converter circuit 270 having five high-order bits and eight low-order bits is 12.8% and that a 1-LSB error δ caused by switching of high-order bits made in the D/A converter circuit 270 having six high-order bits and seven low-order bits is 25.6%. From this, it is known that the D/A converter circuit 270, having four high-order bits and nine low-order bits, of the above embodiment is far superior in accuracy to the D/A converter circuit 270 having five high-order bits and eight low-order bits or having six high-order bits and seven low-order bits, even though the D/A converter circuit 270 of the above embodiment is inferior in terms of area requirement.

Figure 5:
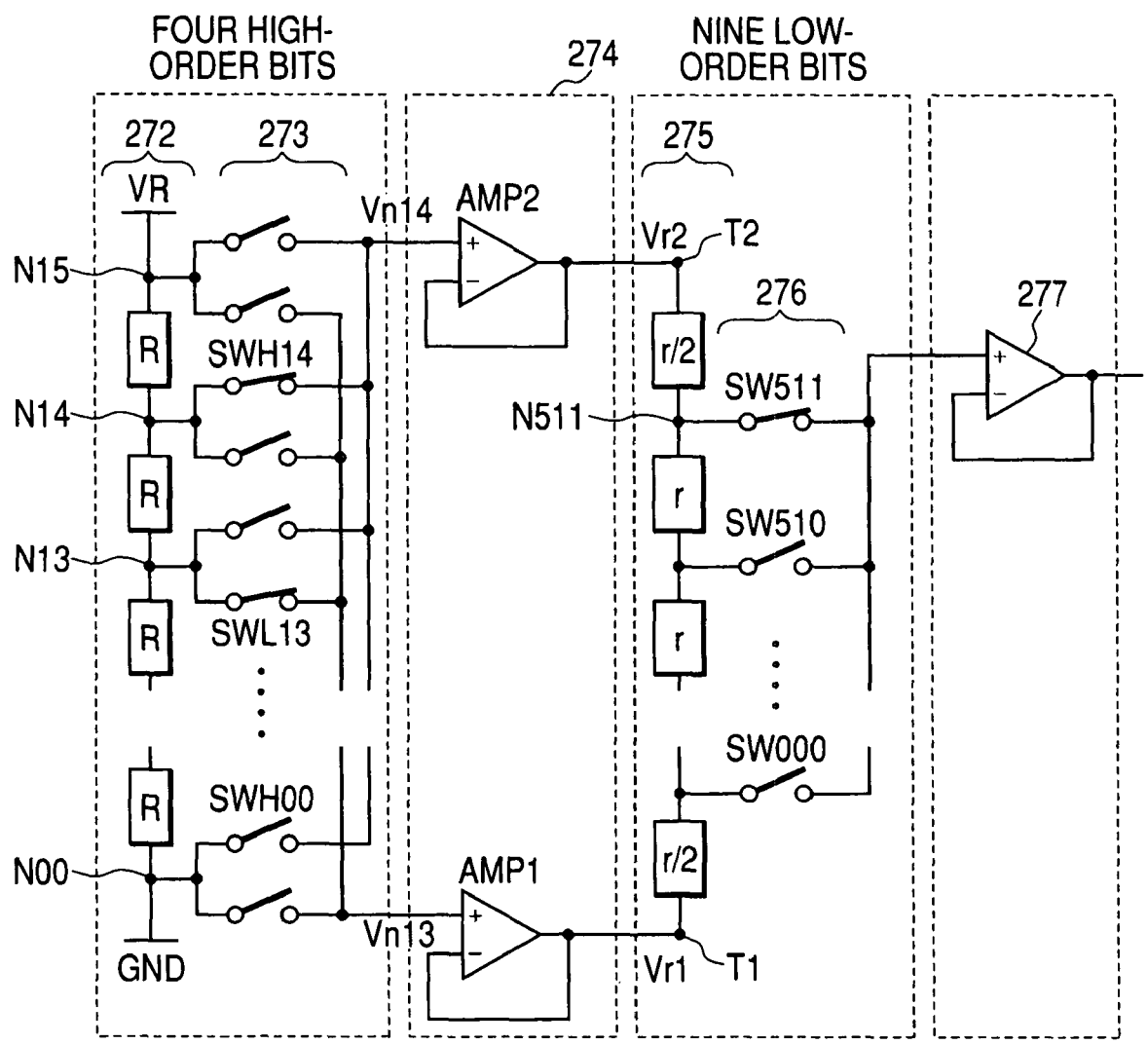
FIG. 5 is a schematic diagram showing a different way of selection made by the selectors in the D/A converter circuit shown in FIG. 4.

The selectors 273 and 276 may also be operated as shown in FIG. 5, turning on switches SWH14 and SWL13 to input the potentials of nodes N14 and N13 of the resistive voltage divider circuit 272 to the amplifiers AMP2 and AMP1, respectively, and turning switch SW511 on to input the potential of node N511 of the resistive voltage divider circuit 275 to the voltage follower 277. In this case, the potential applied to the amplifier AMP2 is always higher than that applied to the amplifier AMP1.

FIG. 6 (B) shows the voltages applied across the resistive voltage divider circuit 275 (applied to taps T2 and T1) in a case where the selectors are operated as shown in FIG. 5 and where the offset voltages of the amplifiers AMP1 and AMP2 are identical in magnitude while being opposite to each other in polarity. Before switching is made for the high-order bits, a voltage of (Vn15+Voff) to (Vn14−Voff) is applied between the taps T2 and T1 of the resistive voltage divider circuit 275. After the switching is made (shown in chain line) for the high-order bits, a voltage of (Vn14+Voff) to (Vn13−Voff) is applied between the taps T2 and T1 of the resistive voltage divider circuit 275. Focusing on the voltage applied to the taps T2 and T1 of the resistive voltage divider circuit 275, even though the potential Vn14 of node N14 of the resistive voltage divider circuit 272 applied to the tap T1 before the switching is made should be applied to the tap T2 after the switching is made, a difference between +Voff and −Voff results between the two voltages. This difference leads to a conversion error.

FIG. 6 (A) shows the voltages applied to taps T2 and T1 of the resistive voltage divider circuit 275 in a case where the selectors are operated as shown in FIG. 4 and where the offset voltages of the amplifiers AMP1 and AMP2 are identical in magnitude while being opposite to each other in polarity. Before switching is made for the high-order bits, a voltage of (Vn15+Voff) to (Vn14−Voff) is applied between the taps T2 and T1 of the resistive voltage divider circuit 275. When the switching is made for the high-order bits, the resistive voltage divider circuit 275 is reversed causing a voltage of (Vn14−Voff) to (Vn13+Voff) to be applied between the taps T1 and T2. Focusing on the tap T1 to which the potential of node N14 of the resistive voltage divider circuit 272 is to be applied, it is known that the switching made for the high-order bits does not change the voltage applied to the tap T1. This is why the D/A converter circuit of the present embodiment involves a smaller conversion error.

Referring to FIGS. 3 and 4, it is known that the input destination of the potentials (such as Vn15 and Vn13) of odd-numbered nodes of the resistive voltage divider circuit 272 is the amplifier AMP2 and that the input destination of the potentials (such as Vn14 and Vn12) of even-numbered nodes of the resistive voltage divider circuit 272 is the amplifier AMP1. Namely, the amplifiers to which potentials of nodes of the resistive voltage divider circuit 272 are applied are unambiguously determined. Therefore, in the arrangement shown in FIG. 2, it may be possible to remove switches SWL15, SWH14, SWL13, . . . SWH00 to halve the number of switches included in the selector 273. There are, however, cases in which, depending on variations in offset voltages of the amplifiers AMP1 and AMP2 and the ratio accuracy of the resistors, conversion accuracy can be enhanced by inputting the potential of an odd-numbered node of the resistive voltage divider circuit 272 to the amplifier AMP1 and inputting the potential of an even-numbered node of the resistive voltage divider circuit 272 to the amplifier AMP2.

In the arrangement shown in FIG. 2, the decoder DEC1 is configured such that the signal levels of outputs SCH00/SCL00 to SCH15/SCL15 corresponding to a same input code are reversed depending on the control signal ACS. This makes it possible to switch, depending on the results of calibration of the D/A converter circuit 270, the node potentials to be supplied to the amplifiers AMP1 and AMP2 of the resistive voltage divider circuit 272 so as to enable the circuit to carry out signal conversion with high accuracy.

According to the above embodiment, it is possible to reduce a total power consumption of a radio communication apparatus provided with a semiconductor integrated circuit for communication (high-frequency IC) having functions for modulating/demodulating and upconverting/downconverting a transmit signal or a received signal and a baseband circuit. Applying the embodiment to a portable telephone makes it possible to lengthen a maximum continuous talk time and a maximum continuous standby time of the portable telephone.

The above embodiment brings about an advantageous effect in which a desired frequency accuracy can be obtained in a high-frequency semiconductor integrated circuit incorporating an oscillator circuit for generating a reference clock signal for use in processing a transmit signal or a received signal, while avoiding an increase in circuit area.

The present invention made by the inventors has been concretely described based on an embodiment, but the present invention is not limited to the embodiment, and various changes and modifications can be made within the scope not departing from the spirit of the invention. For example, the decoder DEC1 may be configured to cause the selector 273 to make selections which are symmetrical between its upper and lower half portions, so that, in its upper half portion, the potential of an odd-numbered node is selected for input to the amplifier AMP1 and so that, in its lower half portion, the potential of an even-numbered node is selected for input to the amplifier AMP1. In addition, an arrangement may be made to reverse the above symmetrical selections depending on the control signal ACS, so that, in the upper half portion of the selector 273, the potential of an even-numbered node is selected for input to the amplifier AMP1 and so that, in the lower half portion of the selector 273, the potential of an odd-numbered node is selected for input to the amplifier AMP1. Furthermore, the control signal ACS may be composed of two bits, so that the decoder DEC1 has four logic options from which to select one.

The D/A converter circuit described in the above embodiment has a 13-bit conversion accuracy and makes conversion in two stages, that is, separately for four high-order bits and for nine low-order bits. The present invention, however, can also be applied to a D/A converter circuit having a 12-bit or lower conversion accuracy or having a 14-bit or higher conversion accuracy, or to a D/A converter circuit which has a 13-bit conversion accuracy and which is configured to make conversion in two stages for five high-order bits and for eight low-order bits.

In the above embodiment, the D/A converter circuit 270 that converts digital frequency control information into an analog signal is provided in addition to the D/A converter circuit 240 that converts digital I and Q signals for transmission supplied from the baseband circuit into analog I and Q signals. In stead of using the two D/A converters, an arrangement may be made in which one common D/A converter is used in time-sharing mode. Such an arrangement will result in a smaller circuit space.

Even though, in the above embodiment, a varactor diode is used as an element for adjusting the oscillation frequency of the voltage-controlled oscillator circuit (VCXO) 262, a different element such as a variable capacitive element or a variable resistive element which can adjust the oscillation frequency by using a control voltage may also be used.

In the foregoing, the present invention made by the inventors has been described focusing on a case in which the invention is applied to a high-frequency IC used in a GSM-type portable telephone—an application field in consideration of which the invention has been made. The application of the present invention, however, is not limited to the GSM-type portable telephone. For example, the present invention can also be applied to a high-frequency IC used in a dual-band portable telephone capable of communication based on two standards, that is, GSM and WCDMA (Wide-band Code Division Multiple Access).

What is claimed is:

1. A semiconductor integrated circuit for communication, comprising:
   a D/A converter circuit which converts digital I and Q signals for transmission supplied from a baseband circuit into analog I and Q signals for transmission;
   a transmission circuit which modulates, using the converted I and Q signals, a carrier and transmits the modulated carrier;
   a reception circuit which generates, by demodulating received signals, received analog I and Q signals;
   an A/D converter circuit which converts the received analog I and Q signals thus generated into received digital I and Q signals; and
   a clock generation circuit which generates a reference clock signal required to generate a high-frequency signal for use in modulation processing performed in the transmission circuit and demodulation processing performed in the reception circuit,
   wherein the clock generation circuit is provided with a voltage-controlled oscillator circuit which oscillates, when a quartz oscillator is connected thereto, at a frequency dependent on a natural frequency of the quartz oscillator and a control voltage applied thereto, and
   wherein the voltage-controlled oscillator circuit is configured such that a result obtained by converting, in an internal D/A converter circuit, digital frequency control information supplied from the baseband circuit is applied as the control voltage to the voltage-controlled oscillator circuit and the voltage-controlled oscillator circuit oscillates at a frequency corresponding to the control voltage,
   further comprising, in addition to the D/A converter circuit, a second D/A converter circuit which converts the digital frequency control information into an analog signal, and
   wherein the second D/A converter circuit is provided with a first conversion section which generates multi-level voltages corresponding to several high-order bits of an input digital signal and a second conversion section which receives the voltages generated in the first conversion section and generates multi-level voltages corresponding to bits other than the several high-order bits of the input digital signal.

2. The semiconductor integrated circuit for communication according to claim 1,
   wherein the digital frequency control information comprises a 13-bit code,
   wherein the first conversion section converts four high-order bits of the 13-bit code, and
   wherein the second conversion section converts nine low-order bits of the 13-bit code.

3. The semiconductor integrated circuit for communication according to claim 1,
   wherein the first conversion section and the second conversion section each includes: a resistive voltage divider circuit which generates multi-level potentials by a prescribed resistance ratio; and a selector circuit which selects a potential of a node of the resistive voltage divider circuit, and
   wherein the selector circuit of the first conversion section,
      when selecting a potential of an odd-numbered node of the resistive voltage divider circuit of the first conversion section, supplies a potential of the selected node to a first tap of the resistive voltage divider circuit of the second conversion section, and,
      when selecting a potential of an even-numbered node of the resistive voltage divider circuit of the first conversion section, supplies a potential of the selected node to a second tap of the resistive voltage divider circuit of the second conversion section.

4. The semiconductor integrated circuit for communication according to claim 3,
   wherein the selector circuit of the first conversion section is configured to be able to supply a potential of either an odd-numbered node or an even-numbered node of the resistive voltage divider circuit of the first conversion section to the first tap of the resistive voltage divider circuit of the second conversion section, and a potential of either an even-numbered node or an odd-numbered node of the resistive voltage divider circuit of the first conversion section to the second tap of the resistive voltage divider circuit of the second conversion section.

5. The semiconductor integrated circuit for communication according to claim 1, comprising:
  a first decoder circuit which generates, by decoding several high-order bits of the input digital signal, a signal for controlling the selector circuit of the first conversion section; and
  a second decoder circuit which generates, by decoding bits other than the several high-order bits of the input digital signal, a signal for controlling the selector circuit of the second conversion section.

6. A semiconductor integrated circuit for communication, comprising:
  a D/A converter circuit which converts digital I and Q signals for transmission supplied from a baseband circuit into analog I and Q signals for transmission;
  a transmission circuit which modulates, using the converted I and Q signals, a carrier and transmits the modulated carrier;
  a reception circuit which generates, by demodulating received signals, received analog I and Q signals,
  an A/D converter circuit which converts the received analog I and Q signals thus generated into received digital I and Q signals;
  a clock generation circuit, which is provided with a voltage-controlled oscillator circuit which oscillates, when an external quartz oscillator is connected thereto, at a frequency dependent on a natural frequency of the quartz oscillator and a control voltage applied thereto, and which generates a reference clock signal required to generate a high-frequency signal for use in modulation processing performed in the transmission circuit and demodulation processing performed in the reception circuit; and
  a second D/A converter circuit which generates, by converting digital frequency control information supplied from the baseband circuit, a voltage to control an oscillation frequency of the voltage-controlled oscillator circuit,
  wherein the second D/A converter circuit includes:
    a first conversion section which generates multi-level voltages corresponding to several high-order bits of an input digital signal; and
    a second conversion section which receives the voltages generated in the first conversion section and generates multi-level voltages corresponding to bits other than the several high-order bits of the input digital signal.

7. The semiconductor integrated circuit for communication according to claim 6, including a digital interface which is used to exchange the digital I and Q signals for transmission and the received digital I and Q signals with the baseband circuit and to receive an analog version of the digital frequency control information.

8. The semiconductor integrated circuit for communication according to claim 6,
  wherein the clock generation circuit is provided with a high-frequency signal generation circuit which generates, based on an oscillator signal generated by the voltage-controlled oscillator circuit, a high-frequency signal for use in modulation processing performed in the transmission circuit and demodulation processing performed in the reception circuit.

9. The semiconductor integrated circuit for communication according to claim 8,
  wherein the clock generation circuit is provided with a timing generation circuit which generates, based on an oscillator signal generated by the voltage-controlled oscillator circuit, an operation clock signal used to operate the D/A converter circuit and the A/D converter circuit.

10. The semiconductor integrated circuit for communication according to claim 6,
  wherein the first conversion section and the second conversion section each includes: a resistive voltage divider circuit which generates multi-level potentials by a prescribed resistance ratio; and a selector circuit which selects a potential of a node of the resistive voltage divider circuit, and
  wherein the selector circuit of the first conversion section supplies
    a potential of an odd-numbered node of the resistive voltage divider circuit of the first conversion section to a first tap of the resistive voltage divider circuit of the second conversion section, and
    a potential of an even-numbered node of the resistive voltage divider circuit of the first conversion section to a second tap of the resistive voltage divider circuit of the second conversion section.

11. The semiconductor integrated circuit for communication according to claim 10,
  wherein the selector circuit of the first conversion section is configured to be able to supply a potential of either an odd-numbered node or an even-numbered node of the resistive voltage divider circuit of the first conversion section to the first tap of the resistive voltage divider circuit of the second conversion section, and a potential of either an even-numbered node or an odd-numbered node of the resistive voltage divider circuit of the first conversion section to the second tap of the resistive voltage divider circuit of the second conversion section.

12. The semiconductor integrated circuit for communication according to claim 6,
  wherein the second D/A converter circuit includes:
    a first decoder circuit which generates, by decoding several high-order bits of the input digital signal, a signal for controlling the selector circuit of the first conversion section; and
    a second decoder circuit which generates, by decoding bits other than the several high-order bits of the input digital signal, a signal for controlling the selector circuit of the second conversion section.

13. A radio communication apparatus comprising:
  a baseband circuit which generates digital I and Q signals for transmission and which decodes received digital I and Q signals;
  a semiconductor integrated circuit for communication, including:
    a D/A converter circuit which receives the digital I and Q signals for transmission supplied from the baseband circuit and converts the digital I and Q signals for transmission thus received into analog I and Q signals for transmission;
    a transmission circuit which modulates, using the converted I and Q signals, a carrier and transmits the modulated carrier;
    a reception circuit which generates, by demodulating received signals, received analog I and Q signals; and
    an A/D converter circuit which converts the received analog I and Q signals thus generated into received digital I and Q signals; and
  a power amplifier circuit which amplifies transmit signals outputted from the semiconductor integrated circuit for communication;

wherein the semiconductor integrated circuit for communication includes:
- a clock generation circuit which is provided with a voltage-controlled oscillator circuit which oscillates, when an external quartz oscillator is connected thereto, at a frequency dependent on a natural frequency of the quartz oscillator and a control voltage applied thereto, and which generates a reference clock signal required to generate a high-frequency signal for use in modulation processing performed in the transmission circuit and demodulation processing performed in the reception circuit; and
- a second D/A converter circuit which generates, by converting digital frequency control information supplied from the baseband circuit into an analog signal, a voltage to control an oscillation frequency of the voltage-controlled oscillator circuit wherein the radio communication apparatus is for making GSM communication, wherein the digital frequency control information comprises a 13-bit code, and wherein the second D/A converter circuit that converts the digital frequency control information into an analog signal is configured to make conversions in two stages, the second D/A converter circuit including a first conversion section which generates multi-level voltages corresponding to four high-order bits of the 13-bit code of the digital frequency control information and a second conversion section which receives the voltages generated in the first conversion section to generate multi-level voltages corresponding to nine low-order bits of the 13-bit code.

14. The radio communication apparatus according to claim 13, wherein the first conversion section and the second conversion section each includes: a resistive voltage divider circuit which generates multi-level potentials by a prescribed resistance ratio; and a selector circuit which selects a potential of a node of the resistive voltage divider circuit, and wherein the selector circuit of the first conversion section supplies
- a potential of an odd-numbered node of the resistive voltage divider circuit of the first conversion section to a first tap of the resistive voltage divider circuit of the second conversion section, and
- a potential of an even-numbered node of the resistive voltage divider circuit of the first conversion section to a second tap of the resistive voltage divider circuit of the second conversion section.

15. The radio communication apparatus according to claim 13, comprising:
- a first decoder circuit which generates, by decoding four high-order bits of the input digital signal, a signal for controlling the selector circuit of the first conversion section; and
- a second decoder circuit which generates, by decoding nine low-order bits of the input digital signal, a signal for controlling the selector circuit of the second conversion section.

\* \* \* \* \*